United States Patent
Resch

(10) Patent No.: US 9,574,481 B2
(45) Date of Patent: Feb. 21, 2017

(54) HEAT EXCHANGER HAVING A THERMOELECTRIC GENERATOR

(71) Applicant: EBERSPÄCHER EXHAUST TECHNOLOGY GMBH & CO. KG, Neunkirchen (DE)

(72) Inventor: Andreas Resch, Esslingen (DE)

(73) Assignee: EBERSPÄCHER EXHAUST TECHNOLOGY GMBH & CO. KG, Neunkirchen (DE)

( * ) Notice: Subject to any disclaimer, the term of this patent is extended or adjusted under 35 U.S.C. 154(b) by 0 days.

(21) Appl. No.: 14/398,275

(22) PCT Filed: May 6, 2013

(86) PCT No.: PCT/EP2013/059392
§ 371 (c)(1),
(2) Date: Oct. 31, 2014

(87) PCT Pub. No.: WO2013/167535
PCT Pub. Date: Nov. 14, 2013

(65) Prior Publication Data
US 2015/0135689 A1 May 21, 2015

(30) Foreign Application Priority Data
May 8, 2012 (DE) .................. 10 2012 207 612

(51) Int. Cl.
*F01N 3/02* (2006.01)
*F01N 5/02* (2006.01)
(Continued)

(52) U.S. Cl.
CPC ............ *F01N 5/025* (2013.01); *F01N 3/0205* (2013.01); *F28D 9/00* (2013.01); *F28D 21/0003* (2013.01);
(Continued)

(58) Field of Classification Search
CPC .......... F01N 5/025; H01L 35/325; H01L 5/30; H01L 5/32; F28D 21/0003; Y02T 10/16; Y02T 10/166
See application file for complete search history.

(56) References Cited

U.S. PATENT DOCUMENTS

| | | |
|---|---|---|
| 3,035,109 A | 5/1962 | Scheckler |
| 2012/0298163 A1 | 11/2012 | Brehm et al. |
| 2013/0327369 A1* | 12/2013 | Jovoic .................... H01L 35/32 136/205 |

FOREIGN PATENT DOCUMENTS

| | | |
|---|---|---|
| DE | 10 2006 039 024 A1 | 2/2008 |
| DE | 10 2008 038 985 A1 | 2/2010 |
| | (Continued) | |

OTHER PUBLICATIONS

Japanese Office Action of Jan. 12, 2016.

*Primary Examiner* — Audrey K Bradley
*Assistant Examiner* — Jason Sheppard
(74) *Attorney, Agent, or Firm* — McGlew and Tuttle, P.C.

(57) ABSTRACT

A heat exchanger (7) for an exhaust gas system (5) of an internal combustion engine (1) includes a thermoelectric generator (13) with plural thermoelectric elements (15) that each have a hot side (16) and a cold side (17). A heating channel (18) conducts a heating medium on the hot sides and a cooling channel (19) conducts cooling medium on the cold sides (17). The thermoelectric generator (13), the heating channel (18), and the cooling channel (19) are arranged adjacent in a stacking direction (20) and form a channel stack (21). A housing (8) that encloses an interior (22) accommodates the channel stack (21) and has medium inlets (9, 11), outlets (10, 12) and electrical connections (14). The thermoelectric elements are arranged in a double-walled intermediate bottom (15) that separates the cooling channel (Continued)

(19) from the heating channel (18), adjacent to said cooling channel, in regard to fluid flow.

17 Claims, 4 Drawing Sheets

(51) Int. Cl.
 *F28D 9/00* (2006.01)
 *F28D 21/00* (2006.01)
 *H01L 35/32* (2006.01)
(52) U.S. Cl.
 CPC .............. *H01L 35/325* (2013.01); *Y02T 10/16* (2013.01); *Y02T 10/20* (2013.01)

(56) References Cited

FOREIGN PATENT DOCUMENTS

| | | |
|---|---|---|
| DE | 10 2010001536 A1 | 8/2011 |
| DE | 10 2010 030259 A1 | 12/2011 |
| JP | 2008-035632 A | 2/2008 |
| WO | 2010/106156 A2 | 9/2010 |
| WO | 2011/083006 A2 | 7/2011 |
| WO | 2011/095255 A2 | 8/2011 |

\* cited by examiner

HEAT EXCHANGER HAVING A THERMOELECTRIC GENERATOR

CROSS REFERENCE TO RELATED APPLICATIONS

This application is a United States National Phase Application of International Application PCT/EP2013/059392 filed May 6, 2013 and claims the benefit of priority under 35 U.S.C. §119 of German Patent Application DE 10 2012 207 612.3 filed May 8, 2012, the entire contents of which are incorporated herein by reference.

FIELD OF THE INVENTION

The present invention relates to a heat exchanger, in particular for an exhaust system of an internal combustion engine, preferentially in a motor vehicle. The present invention additionally relates to an internal combustion engine equipped with such a heat exchanger.

BACKGROUND OF THE INVENTION

In order to improve the energetic efficiency in internal combustion engines, in particular in vehicle applications, there are endeavors of utilizing heat energy, which is contained in the exhaust gas of the internal combustion engine. A possibility for utilizing the heat energy contained in the exhaust gas is the use of so-called thermoelectric generators, which can convert a temperature difference into an electric voltage or a heat flow into an electric current. Such thermoelectric generators operate according to the so-called Seebeck effect, which corresponds to an inversion of the so-called Peltier effect.

A thermoelectric generator usually consists of multiple individual thermoelectric elements, which can also be called thermoelectric modules and which in each case have a hot side and a cold side. By feeding heat to the hot side and by discharging heat on the cold side, a heat flow can be passed through the respective thermoelectric element which in the thermoelectric element is converted into an electric current. In order to be able to supply the hot side with heat and the cold side with cold a thermoelectric generator can be practically integrated in a heat exchanger, which comprises at least one heating channel for conducting a heating medium and at least one cooling channel for conducting a cooling medium. A thermoelectric generator is then arranged between such a heating channel and such a cooling channel so that the heating channel is located on the hot side of the respective thermoelectric generator and the cooling channel on the cold side of the respective thermoelectric generator. For this purpose, the heating channel, the thermoelectric generator and the cooling channel are stacked on top of one another in a stacking direction, thus forming a channel stack.

Such a thermoelectric element or such a thermoelectric module consists of a multitude of semiconductor elements, which convert a heat flow into an electrode flow and vice versa. In the respective thermoelectric element, multiple such semiconductor elements are usually connected in series. In particular, positively doped semiconductor elements, p-conductors in brief, and negatively doped semiconductor elements, n-conductors in brief, are connected in series alternating with one another. The electrical connection of successive p-conductors and n-conductors is usually effected by means of bridge elements, which preferably consist of a metal. Combined, this means that the respective thermoelectric element comprises a multitude of thermoelectrically acting semiconductor elements.

In the case of certain semiconductor materials, which within the respective thermoelectric element bring about the thermoelectric conversion, it can be required to protect these from contact with oxygen. To this end it is usual with conventional thermoelectric generators to hermetically encapsulate each individual thermoelectric element by itself. This encapsulation is effected with a type of casing or cover, which completely encloses and covers the respective thermoelectric element. Depending on the material of this casing or this cover, additional thermal resistance develops at this point which reduces the efficiency of the thermoelectric generator. A thermoelectric generator having multiple thermoelectric elements thus comprises multiple thermoelectric elements which are thus separately encapsulated each by itself, which in their encapsulation comprise multiple thermoelectric semiconductor elements each.

SUMMARY OF THE INVENTION

The present invention deals with the problem of providing an improved embodiment for a heat exchanger of the type mentioned at the outset which is characterized in particular by a simplified construction. Efforts are additionally made of achieving an increased energetic efficiency in the conversion of heat into electricity for such a heat exchanger.

The invention is based on the general idea of equipping the heat exchanger with a housing which covers an interior space of the housing and in which at least one double-walled intermediate bottom or partition is arranged, which on the one hand serves for accommodating the thermoelectric elements of the respective thermoelectric generator and on the other hand directly fluidically separates a cooling channel from a heating channel. The double-walled intermediate bottom thus has a dual function, since with its two walls it forms a receiving space for the respective thermoelectric generator and towards the outside bounds a cooling channel with its two walls on the one hand and a heating channel on the other hand. In this way, the respective thermoelectric generator can be encapsulated as a whole in the intermediate bottom in connection with the housing, into which the intermediate bottom is inserted, as a result of which the interior of the intermediate bottom can be hermetically sealed towards the outside. For example, the intermediate bottom can be designed as a flat tube which at its longitudinal ends is closed off by the housing of the heat exchanger. It is likewise possible to design the two walls of the intermediate bottom as separate plates, which are tightly enclosed along their circumferential edge by the housing of the heat exchanger.

In other words, the invention proposes to separate in the housing with the help of at least one such double-walled intermediate bottom on the one hand the receptive heating channel from the respective cooling channel and on the other hand separate the respective thermoelectric generator on the one hand from the respective cooling channel and from the respective heating channel on the other hand. In comparison with a conventional design, which realizes the respective heating channel and the respective cooling channel with the help of tubes, between which the respective thermoelectric generator can then be arranged, the heat exchanger according to the invention only requires an intermediate bottom instead of a heating tube and of a cooling tube, as a result of which clearly fewer components have to be used in order to realize the heat exchanger. This is also possible through the respective double-walled intermediate bottom in connection with the housing, which covers the interior of the heat exchanger on all sides.

In particular, in a vehicle application, the coolant of a cooling circuit of an internal combustion engine can be used for example as cooling medium while the exhaust gas of the internal combustion engine can be used as heating medium.

The double-walled intermediate bottom in this case can be realized with the help of two separate walls, which are inserted into the housing of the heat exchanger. The thermoelectric elements of the respective thermoelectric generators in this case are arranged between the two walls. Alternatively it is possible according to a preferred embodiment to realize the respective double-walled intermediate bottom with the help of a flat tube, into which the thermoelectric elements of the thermoelectric generator are inserted and which is installed in the housing of heat exchanger.

In another advantageous embodiment, the respective intermediate bottom can comprise a hot wall, a cool wall and an intermediate space formed between hot wall and cool wall, wherein in the installed state the respective hot wall bounds such a heating channel in such a manner that it separates the intermediate space from the heating medium of this heating channel. Furthermore, the respective cooling wall bounds such a cooling channel in such a manner that it separates the intermediate space from the cooling medium of this cooling channel. Furthermore, the thermoelectric elements of the respective thermoelectric generator can be arranged in the respective intermediate space in such a manner that the hot sides of the thermoelectric elements directly or indirectly contact the heating wall and the cold sides of the thermoelectric elements directly or indirectly contact the cooling wall. Provided that the respective wall and the respective side can be produced sufficiently flat direct contact between the respective side and the respective wall is preferred. Frequently, manufacturing tolerances however cannot be selected so closely that adequate areal contact between the respective side and the receptive wall can be ensured. In this case, indirect contacting via a heat conductive material is then preferred which for example is arranged between the respective side and the respective wall in the form of a film or a paste and is characterized by elasticity for offsetting irregularities and by high heat transfer performance.

Independently of the specific realization of the double-walled intermediate bottom the possibility of hermetically encapsulating the respective thermoelectric generator as a whole, i.e. as a unit, arises through the use of such a double-walled intermediate bottom. By encapsulating the thermoelectric generator, the entire thermoelectric generator as well as the individual thermoelectric elements is protected from contact with oxygen. As a consequence, it is possible in principle to accommodate the individual thermoelectric elements in the intermediate bottom in the unencapsulated state. Because of this, a wall each can be avoided on the hot side and also on the cold side, which of necessity has a thermal resistance. Thus, the energetic efficiency of the heat exchanger as a whole can be improved. In the case of unencapsulated thermoelectric elements no additional hermetic encapsulation of the thermoelectric semiconductors of the at least two thermoelectric elements is provided within the intermediate bottom, i.e. the semiconductor elements of multiple thermoelectric elements are located in the same hollow space, namely in the intermediate bottom. In other words, a fluid, e.g. a gas, preferentially a gas that is inert for the semiconductor elements or inert gas, or a vacuum is in contact in the intermediate bottom with all semiconductor elements of the thermoelectric elements of the respective thermoelectric generator.

Accordingly, it can be provided according to a particularly advantageous embodiment that the thermoelectric elements of the respective thermoelectric generator are individually unencapsulated in the receptive intermediate bottom while they are encapsulated altogether as a group through the respective intermediate bottom. Additionally or alternatively, it can be provided that a thermoelectric body of the respective thermoelectric element, which consists of a thermoelectric material, namely of a multitude of thermoelectric semiconductors, directly or indirectly contacts the walls of the respective intermediate bottom on sides facing away from one another, which form the cold side and the hot side. Usually, the semiconductor elements which are arranged a really and preferentially flat in columns and lines are electrically contacted with one another at an upper width and at a lower side of the thermoelectric element in pairs by means of electrically conductive contact bridges, in particular metal bridges. On the contact bridges, a practically plate-shaped and in particular flat, electrical insulator can each be arranged on the contact bridges on the top and on the bottom sides. In the unencapsulated state, the respective insulator forms the cold side and the hot side respectively of the respective thermoelectric element.

In another advantageous embodiment, at least two such heating channels can be fluidically connected to one another via heating medium connecting tubes, which extend through a cooling channel and through two intermediate bottoms. Because of this, multiple heating channels can be fluidically connected to one another within the channel stack in such a manner that multiple heating channels, preferentially all heating channels, can be incorporated into a heating medium path via a common heating medium inlet and a common heating medium outlet.

Additionally or alternatively it can be provided that at least two such cooling channels are fluidically connected to one another via cooling medium connecting tubes, which extend through a heating channel and through two intermediate bottoms. This measure also results in that multiple cooling channels within the housing can be fluidically coupled to one another so that on the housing a common cooling medium inlet and a common cooling medium outlet are sufficient in order to incorporate at least two cooling channels, preferentially all cooling channels, in a cooling medium path.

Practically, in a further development, the heating medium connecting tubes and/or the cooling medium connecting tubes can extend spaced from the housing in the interior of the housing. In this way, the respective connecting tubes are subjected to the circulation of heating medium and of cooling medium about them. In an alternative embodiment, the with respect to the stacking direction first channel and the last channel in the channel stack can be of the same type, i.e. either of the type heating channel or of the type cooling channel. In this case, the channel stack according to a particularly advantageous embodiment in the housing can be enclosed transversely to the stacking direction closed in a circumferential direction by connecting channels which fluidically connect the first channel and the last channel and any further channel of the same type that may be present with one another. In this way, the intermediate bottoms in this circumferential direction are then automatically enclosed also by the connecting channels or by the first and last channel and thus encapsulated within the fluid carried therein. The circumferential direction, in which the connecting channels enclose the channel stack in the housing, can relate to the stacking direction so that the connecting channels comprise two face end channels and two long-side channels each of which connect the first channel and the last channel with one another. Alternatively to this, the circumferential can also relate to a transverse direction running transversely to the stacking direction and transversely to the longitudinal direction of the channel stack. In this case, the connecting channels only consist of the face end channels which connect the first channel with the last channel.

Particularly advantageous here is a further development, in which the first channel and the last channel are cooling channels. Thus, a cover of cooling medium is present between the thermoelectric elements and surroundings surrounding the housing. It has been shown that adequate sealing of a liquid (cooling medium) with respect to a gas (ambient air) can be more easily realized than sealing a first gas (exhaust gas) relative to a second gas (ambient air).

The respective intermediate space according to an advantageous embodiment can be sealed both with respect to the coolant and also with respect to the heating medium. Such sealing is simplified in particular when the intermediate bottom is designed as a flat tube.

In another advantageous embodiment, the respective intermediate space can be filled with an inert gas or contain a vacuum. In both cases, a particularly efficient protection of the thermoelectric elements from contact with oxygen is obtained.

Accordingly, an internal combustion engine according to the invention, which can in particular be arranged in a motor vehicle, is characterized by an engine block having multiple combustion chambers, by an exhaust system discharging exhaust gas from the combustion chambers, by a cooling circuit for cooling the engine block and by heat exchanger of the type described above, the heating channels of which are fluidically coupled to the exhaust system and the cooling channels of which are fluidically coupled to the cooling circuit.

It is to be understood that the features mentioned above and still to be explained in the following cannot only be used in the respective combination stated but also in other combinations or by themselves without leaving the scope of the present invention.

Preferred exemplary embodiments of the invention are shown in the drawing and are explained in more detail in the following description, wherein same reference characters relate to same or similar or functionally same components.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
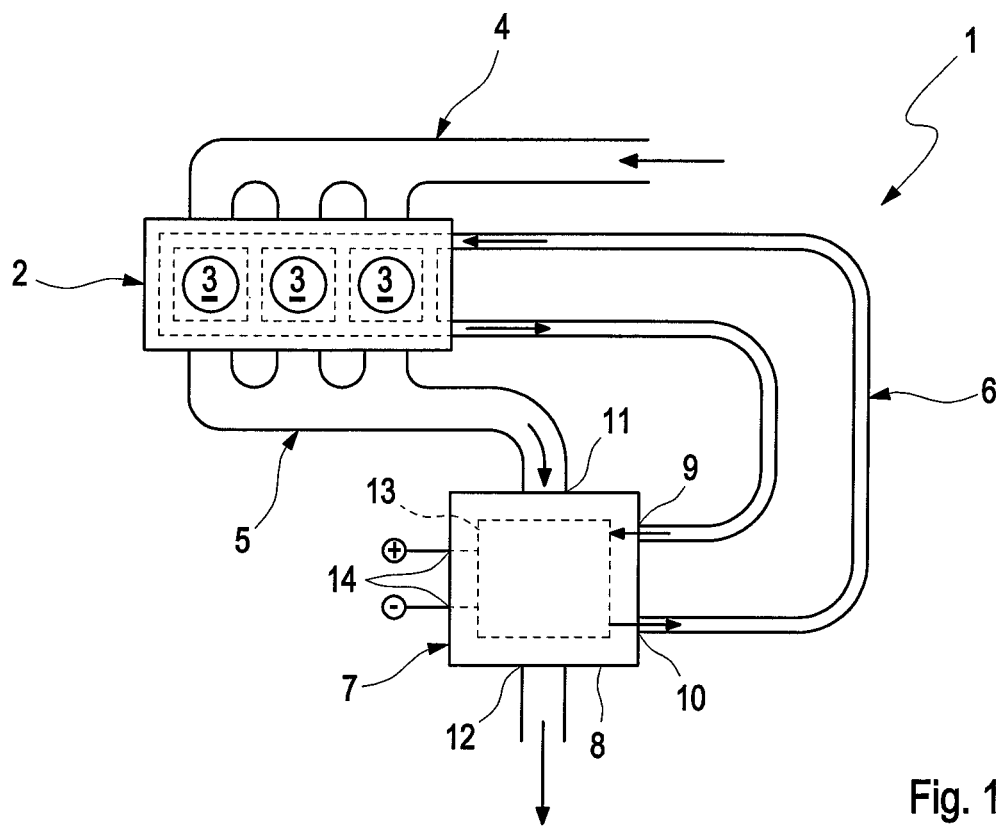
FIG. 1 is a highly simplified schematic representation in the manner of a circuit diagram of an internal combustion engine.

According to FIG. 1, an internal combustion engine 1, which can preferably be employed in a motor vehicle, comprises an engine block 2, which contains multiple combustion chambers 3, a fresh air system 4 for supplying the combustion chambers 3 with fresh air and an exhaust system 5 for discharging exhaust gas from the combustion chambers 3. Furthermore, the internal combustion engine 1 is equipped with a cooling circuit 6, with the help of which the engine block 2 can be cooled. Here it is clear that in the cooling circuit 6 a cooler which is not shown here, if appropriate in connection with a fan, can be additionally provided in order to be able to suitably cool the coolant carried in the cooling circuit 6.

The internal combustion engine 1 is additionally equipped with a heat exchanger 7, the housing 8 of which comprises a cooling medium inlet 9, a cooling medium outlet 10, a heating medium inlet 11 and a heating medium outlet 12. The heat exchanger 7 is fluidically incorporated in the exhaust system 5 via its heating medium inlet 11 and its heating medium outlet 12, wherein the exhaust gas in the heat exchanger 7 serves as heating medium. Furthermore, the heat exchanger 7 via its cooling medium inlet 9 and its cooling medium outlet 10 is incorporated in the cooling circuit 6, the coolant of which also serves as cooling medium in the heat exchanger 7. The heat exchanger 7 additionally contains at least one thermoelectric generator 13, which in the interior of the heat exchanger 7 is coupled to the heating medium and the cooling medium in a heat-transferring manner. On the housing 8, electrical connections 14 are formed which are suitably electrically connected to the respective thermoelectric generator 13.

Figure 2:
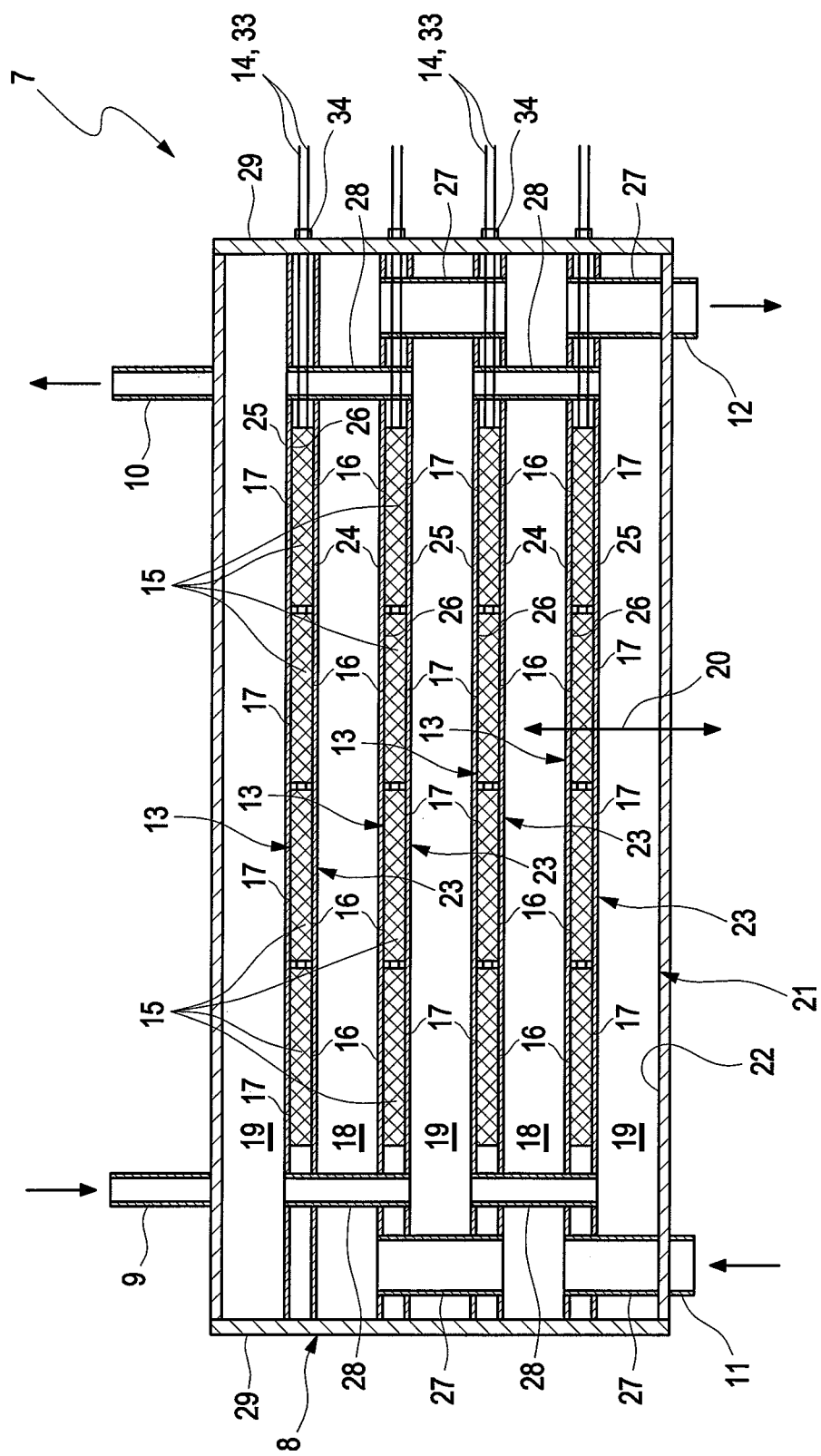
FIG. 2 is a highly simplified longitudinal sectional view through a heat exchanger.
Figure 3:
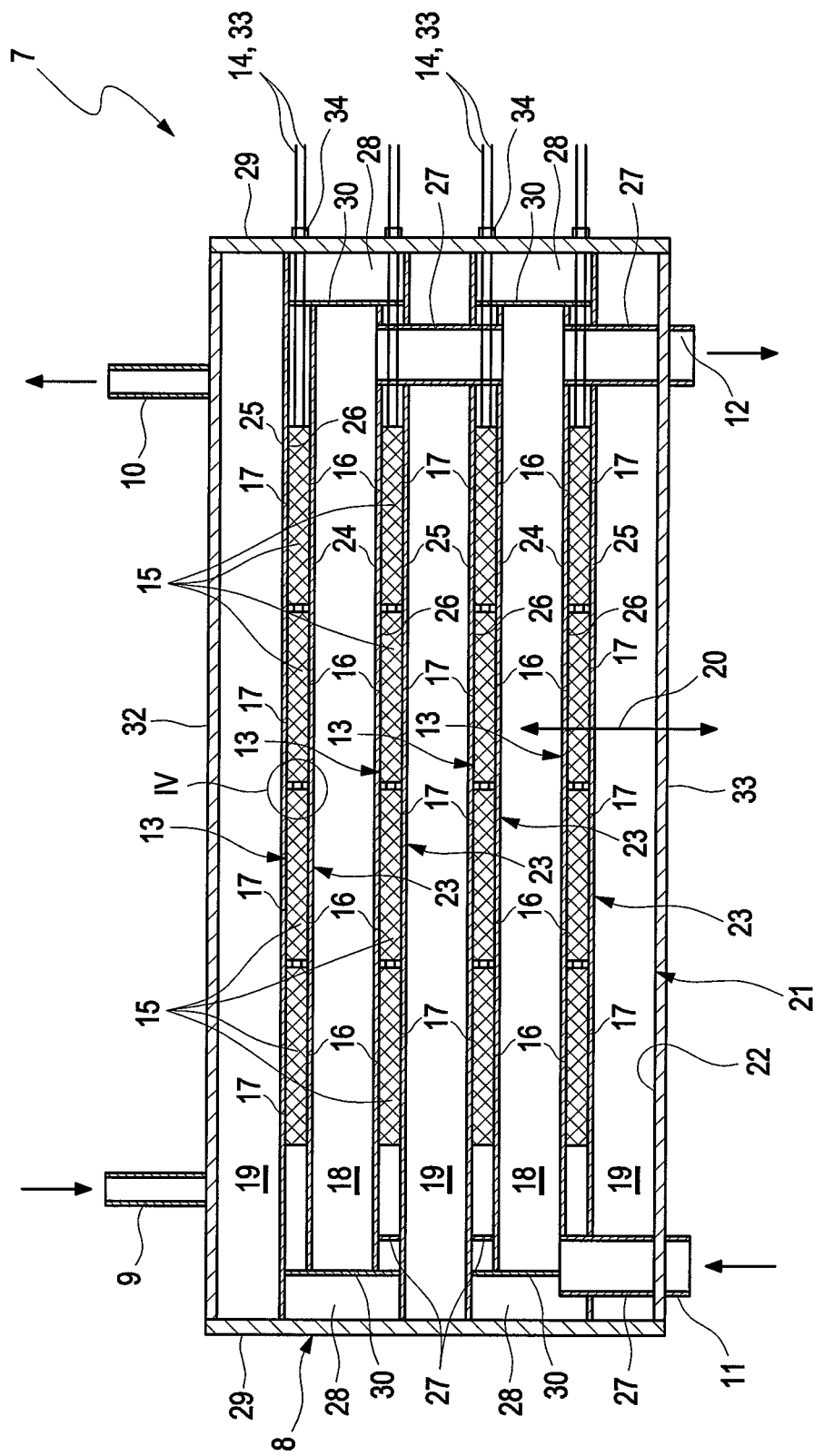
FIG. 3 is a longitudinal sectional view through a heat exchanger as in FIG. 2, however showing another embodiment.

According to the FIGS. 2 and 3, the respective heat exchanger 7 preferentially comprises multiple thermoelectric generators 13, each of which comprise multiple separate thermoelectric elements 15. In the example, four thermoelectric generators 13 are provided, which each have four thermoelectric elements 15. Each thermoelectric element 15 has a hot side 16 and a cold side 17 located opposite the former. In the heat exchanger 7, multiple heating channels 18 for carrying the heating medium are formed, which are arranged on the hot sides 16 of the thermoelectric elements 15. Furthermore, multiple cooling channels 19 are provided in the heat exchanger 7, which carry the cooling medium and which are arranged on the cold sides 17 of the thermoelectric elements 15. The thermoelectric generators 13, the heating channels 18 and the cooling channels 19 are alternately arranged adjacently in a stacking direction 20 indicated by a double arrow and in the process form a channel stack 21, which is received in an interior space 22 covered by the housing 8. For all heating channels 18, the housing 8 has a common heating medium inlet 11 and a common heating medium outlet 12. For all cooling medium channels 19, the housing 8 has a common cooling medium inlet 9 and a common cooling medium outlet 10.

In the interior space 22 of the housing 8, the four double-walled intermediate bottoms or partitions 23 are each accommodated in the examples shown here, wherein in each intermediate bottom 23 such a thermoelectric generator 13 with its associated thermoelectric elements 15 is arranged.

Furthermore, the respective intermediate bottom 23 is arranged in a housing 8 so that it fluidically separates in each case such a cooling channel 19 from such a heating channel 18.

In detail, the respective intermediate bottom 23 can each comprise a hot wall 24 and a cooling wall 25 each as well as an intermediate space 26, which in each case is formed between the associated hot wall 24 and the associated cold wall 25. The respective hot wall 24 bounds a heating channel 18 and thus separates the intermediate space 26 from the heating medium of the heating channel 18. The respective cooling wall 25 bounds such a cooling channel 19 and separates the intermediate space 26 from the cooling medium of the respective cooling channel 19. In the respective intermediate space 26, the thermoelectric elements 15 of the respective thermoelectric generator 13 are now arranged, namely practically in such a manner that the hot sides 16 of the thermoelectric elements 15 directly or indirectly contact the respective heating wall 24, while the cold sides 17 of the thermoelectric elements 15 directly or indirectly contact the respective cooling wall 25.

In the respective intermediate bottom 23, the hot wall 24 and the cold wall 25 can be formed through separate, in particular flat, wall elements or plates, which are inserted in the housing 8 in a suitable manner. Particularly advantageous, by contrast, is an embodiment in which the respective intermediate bottom 23 is formed by a flat tube, the wide sides of which form the hot wall 24 and the cooling wall 25 and the short sides of which each contact a side wall of the housing 8.

Practically, the thermoelectric elements 15 can be arranged individually unencapsulated in the intermediate bottom 23. This means that with the respective thermoelectric element 15 a thermoelectric body, which comprises the hot side 16 and the cold side 17 and consists of a thermoelectric material, directly or indirectly contacts the heating wall 24 and the cooling wall 25 respectively. The arrangement of the respective intermediate bottom 23 in the housing 8 by contrast can be practically effected in such a manner that by doing so the thermoelectric elements 15 of the respective thermoelectric generator 13 are encapsulated as a group in the respective intermediate bottom 23.

In the embodiments shown in FIGS. 2 and 3, all heating channels 18 are fluidically connected to one another via heating medium connecting tubes 27, wherein these heating medium connecting tubes 27 in each case are routed through at least one cooling channel 19 and through at least one intermediate bottom 23. Furthermore, all cooling channels 19 are fluidically connected to one another via cooling medium connecting tubes 28 here, wherein the cooling medium connecting tubes 28 in each case extend through at least one heating channel 18 and through at least one intermediate bottom 23.

In the embodiment shown in FIG. 2, both the heating medium connecting tubes 27 as well as the cooling medium connecting tubes 28 are arranged in the interior space 22 spaced from the housing 8. In contrast with this, FIG. 3 shows an embodiment in which only the heating medium connecting tubes 27 are arranged in the interior space 22 spaced from the housing 8, while the cooling medium connecting tubes 28 on face ends 29 of the housing 8 are realized with the help of separating walls 30 in the form of channels. These separating walls 30 in this case are arranged in the interior space 22 spaced from the respective face end 29 so that an intermediate space formed between the respective separating wall 30 and a housing section assigned to the respective face end 29 forms a cooling medium connecting channel which in the following is likewise designated 28.

In the embodiment shown in FIG. 3, the, with respect to the stacking direction 20 within the channel stack 21, first or lowermost channel and the last or uppermost channel are of the same type, namely of the type cooling channel 19. The connecting channels 28 created with the help of the separating walls 30 now connect the first and last cooling channel 19 and the middle cooling channel 19 arranged here in between with one another. With respect to a circumferential direction, which relates to a transverse direction perpendicularly standing on the drawing plane of FIG. 3 and extending transversely to the longitudinal direction of the channel stack 21 and transversely to the stacking direction 20, the channel stack 21 is enclosed closed in the housing 8 by the connecting channels 28 and the first cooling channel 19 as well as the last cooling channel 19. The channel stack 21 in this case comprises the lowermost or first intermediate bottom 23, the last or uppermost intermediate bottom 23 as well as all intermediate bottoms 23, cooling channels 19 and heating channels 18 located in between.

Additionally or alternatively, the connecting channels 28 can enclose the channel stack 21 closed in a circumferential direction which relates to the stacking direction 20. In this case, further separating walls 30 are provided which are spaced from the long sides of the housing 8, which extends between the face ends 29 and between a lower side 31 and an upper side 32. With the help of these separating walls 30, further connecting channels 28 can be created along these side walls which in FIG. 3 are located both on a side of the housing facing the beholder and also on a side facing away from the beholder. In this case, the channel stack 21, as far as it extends between the lowermost and the uppermost intermediate bottom 23, is surrounded by cooling medium on all sides.

In an advantageous embodiment it can be provided that the respective intermediate space 26 of the intermediate bottoms 23 is filled with an inert gas or contains a vacuum. In this case, the intermediate spaces 23 are practically sealed both with respect to the cooling medium and also with respect to the heating medium.

According to the FIGS. 2 and 3, electrical lines 33 for realizing the respective electrical connection 14 can be led through the housing 8 from the intermediate space 26 with the help of a suitable, fluid-tight bushing 34.

Figure 4:
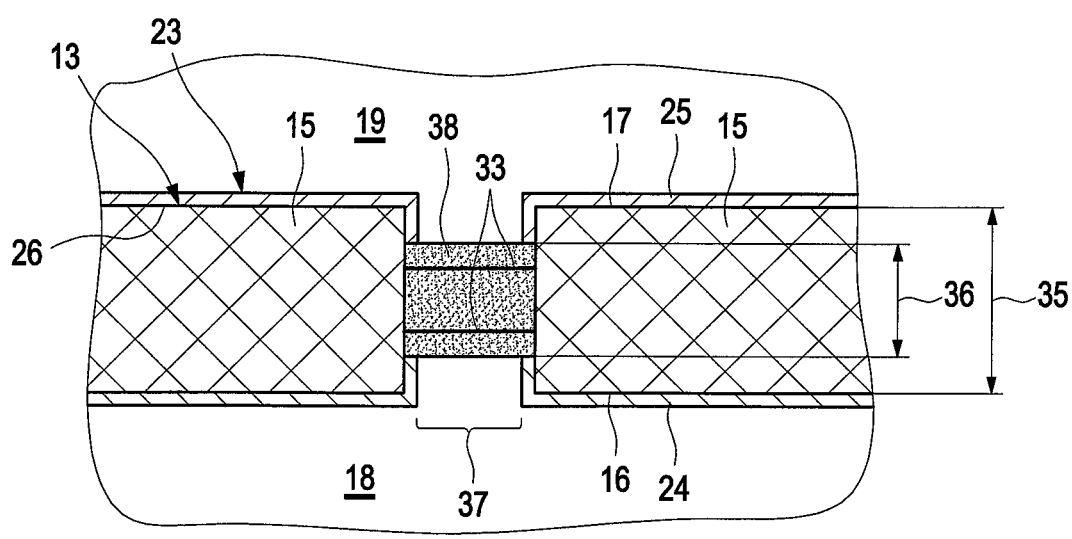
FIG. 4 is an enlarged view showing detail IV from FIG. 3.

According to FIG. 4, corresponding to another advantageous embodiment, it is possible to adapt the walls 24, 25 of the intermediate bottoms 23 with respect to their shape to the thermoelectric elements 15 so that they are adapted to the outer contour of the thermoelectric elements 15. Accordingly, a spacing 35 in particular between the hot wall 24 and the cold wall 25 in the region of such a thermoelectric element 15 can be greater than a spacing 36 which the two walls 24, 25 have in a region 37, which is located between adjacent thermoelectric elements 15 and through which electrical contacting by means of suitable lines 33 of the adjacent electrical lines is effected. In particular, the walls 24, 25 in the region of the thermoelectric elements 15 can be particularly thin so that they substantially fulfill only a sealing function while they can have an increased stability in the region 37 between adjacent thermoelectric elements 15 in order to be able to support the pressure differences between the channels 18, 19 and the intermediate space 26. Alternatively, it can be provided to fill out the intermediate space 26 in the intermediate region 37 by means of a suitable grout 38 so that in this intermediate region 37 reduced wall thicknesses for the walls 24, 25 are also possible. Alternatively, the walls 24, 25 can be omitted in the respective grouted intermediate region 37.

Figure 5:
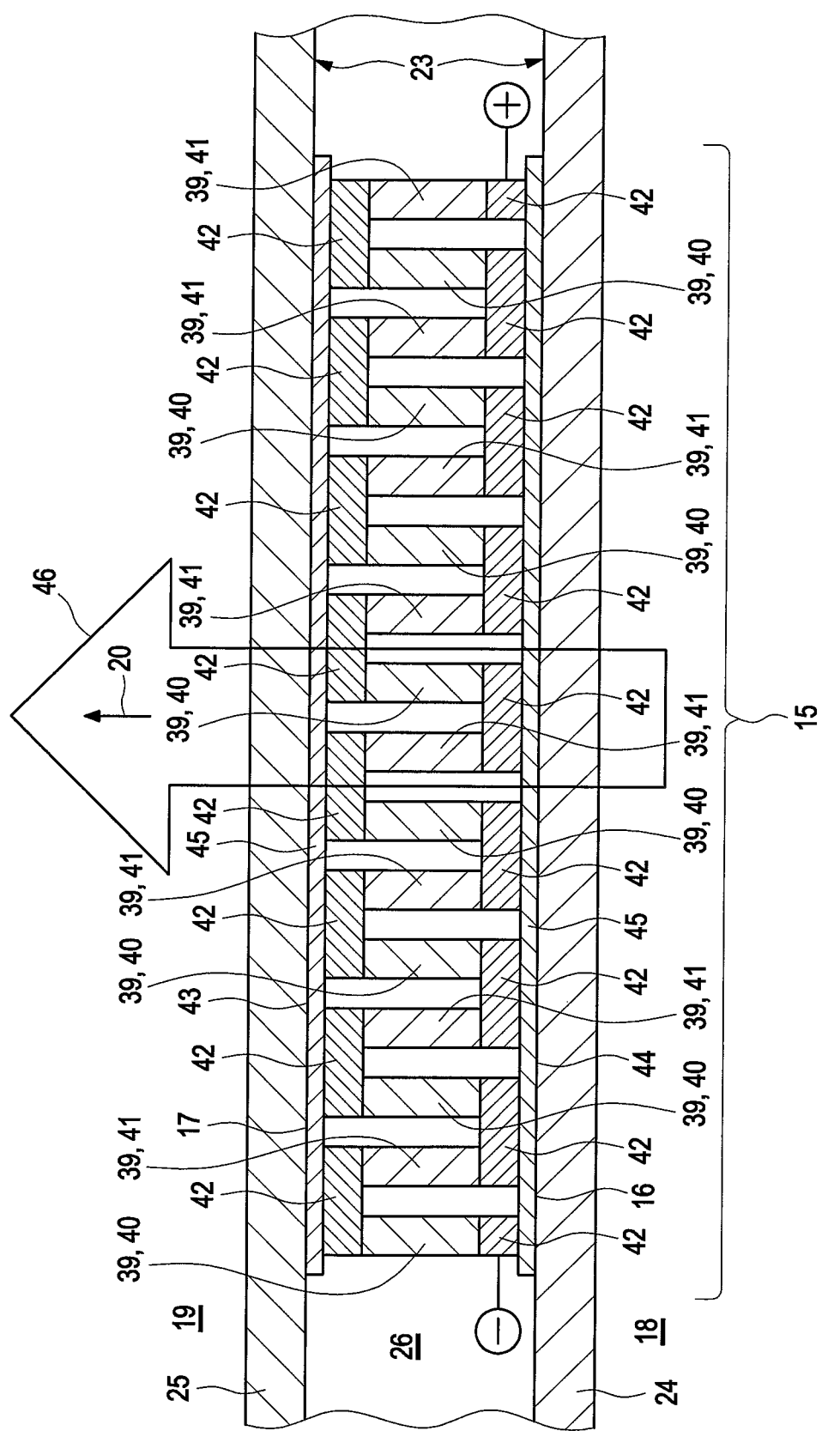
FIG. 5 is a highly simplified longitudinal sectional view through an individual thermoelectric element.

In FIG. 5, a typical construction of an individual thermoelectric element 15 is purely exemplarily shown, which according to a preferred embodiment of the heat exchanger 7 according to the invention introduced here is unencapsulated. The thermoelectric element 15 comprises a multitude of individual thermoelectric semiconductor elements 39 which are preferentially arranged in a plane in multiple lines and columns. In FIG. 5, only one line is noticeable, which for forming the columns is followed by multiple lines in the depth direction of FIG. 5. The semiconductor elements 39 are variously doped so that negatively doped N-conductors 40 and positively doped P-conductors 41 are provided, which alternate. Each two adjacent conductors 40, 41 are electrically connected to one another via a contact bridge 42, in particular a metal bridge. The contact bridges in this case extend on a top side 43 of the electrothermal element 15, which in this case is formed through the cold side 17, and on a lower side 44 of the electrothermal element 15, which in this case is formed through the hot side 16, in each case in a plane and are each covered by an electrical insulator 45. The respective electrothermal element 15 is in contact with the hot wall 24 and with the cold wall 25 respectively via this insulator 45. An arrow 46 indicates the heat flow through the respective thermoelectric element 15.

While specific embodiments of the invention have been shown and described in detail to illustrate the application of the principles of the invention, it will be understood that the invention may be embodied otherwise without departing from such principles.

The invention claimed is:

1. A heat exchanger, in particular for an exhaust system of an internal combustion engine, the heat exchanger comprising:
   a thermoelectric generator comprising multiple-thermoelectric elements, each of which have a hot side and a cold side;
   a heating channel for conducting a heating medium, the heating channel being arranged on the hot sides of the thermoelectric elements of the thermoelectric generator;
   a cooling channel for conducting a cooling medium, the cooling channel being arranged on the cold sides of the thermoelectric elements of the thermoelectric generator, wherein the thermoelectric generator, the heating channel and the cooling channel are arranged adjacent to each other in a stacking direction and form a channel stack, in the channel stack, with respect to the stacking, the first channel and the last channel are heating channels or cooling channels;
   a housing covering an interior space, the interior space receiving the channel stack, the housing comprising a cooling medium inlet, a cooling medium outlet, a heating medium inlet and a heating medium outlet and electrical connections for the thermoelectric generator, the housing having sidewalls on diametrically opposite sides of the interior space;
   a double-walled intermediate bottom in the interior space of the housing, the thermoelectric elements of the thermoelectric generator being arranged in the double-walled intermediate bottom which fluidically separates the cooling channel from the heating channel which is adjacent thereto, the double-walled intermediate bottom having one end mounted on one of the sidewalls, the double-walled intermediate bottom having another end mounted on the other one of the sidewalls, the double-walled intermediate bottom extending from the one sidewall to the other side wall, the thermoelectric elements of the thermoelectric generator in the intermediate bottom being individually unencapsulated and are encapsulated as a group through the intermediate bottom;
   in the channel stack in the stacking direction there is a first and a last intermediate bottom in the housing that is enclosed transversely to the stacking direction and is closed in a circumferential direction by connecting channels, which fluidically connect the first channel and the last channel as well as each further channel of the same type that may be present with one another.

2. The heat exchanger according to claim 1, wherein each thermoelectric element comprises multiple thermoelectric semiconductor elements, which are configured as p-conductors and n-conductors.

3. The heat exchanger according to claim 1, wherein:
   the intermediate bottom comprises a hot wall, a cooling wall and an intermediate space formed between hot wall and cooling wall;
   the hot wall bounds the heating channel and separates the intermediate space from the heating medium of the heating channel;
   the cooling wall bounds the cooling channel and separates the intermediate space from the cooling medium of the cooling channel;
   the thermoelectric elements of the thermoelectric generator are arranged in the intermediate space, so that the hot sides of the thermoelectric elements directly or indirectly contact the heating wall and the cold sides of the thermoelectric elements directly or indirectly contact the cooling wall.

4. The heat exchanger according to claim 3, wherein the intermediate space is sealed both with respect to the cooling medium and also with respect to the heating medium.

5. The heat exchanger according to claim 4, wherein the intermediate space is filled with an inert gas or contains a vacuum.

6. The heat exchanger according to claim 1, further comprising:
   heating medium connecting tubes;
   cooling medium connecting tubes;
   another heating channel to provide at least two heating channels; and
   another cooling channel to provide at least two cooling channels wherein at least one of:
   the at least two heating channels are fluidically connected to one another via one of the heating medium connecting tubes, said one of the heating medium connecting tubes extending through one of the cooling channels and another of the heating medium connecting tubes extending through at least one intermediate bottom; and
   the at least two cooling medium channels are fluidically connected to one another via one of the cooling medium connecting tubes, said one of the cooling medium connecting tubes extending through one of the heating channels and through at least one intermediate bottom.

7. The heat exchanger according to claim 1, wherein the circumferential direction relates to the stacking direction or to a transverse direction running transversely to the stacking direction and transversely to the longitudinal direction of the channel stack.

8. The heat exchanger according to claim 1, wherein the first channel and the last channel are cooling channels.

9. The heat exchanger according to claim 1, wherein the intermediate bottom is formed by two separate walls which are arranged in the housing and in the stacking direction are spaced from one another.

10. The heat exchanger according to claim 1, wherein the intermediate bottom is formed by a flat tube inserted in the housing.

11. An internal combustion engine for a motor vehicle, the internal combustion engine comprising:
- an engine block, containing multiple combustion chambers;
- an exhaust system for discharging exhaust gas from the combustion chambers;
- a cooling circuit for cooling the engine block;
- a heat exchanger comprising:
- a thermoelectric generator comprising multiple-thermoelectric elements, each of which has a hot side and a cold side;
- a heating channel for conducting a heating medium, the heating channel being arranged on the hot sides of the thermoelectric elements of the thermoelectric generator;
- a cooling channel for conducting a cooling medium, the cooling channel being arranged on the cold sides of the thermoelectric elements of the thermoelectric generator, wherein the thermoelectric generator, the heating channel and the cooling channel are arranged adjacent to each other in a stacking direction and form a channel stack;
- a housing covering an interior space, the housing having sidewalls on diametrically opposite sides of the interior space, the interior space receiving the channel stack, the housing comprising a cooling medium inlet, a cooling medium outlet, a heating medium inlet and a heating medium outlet and electrical connections for the thermoelectric generator;
- a double-walled intermediate bottom in the interior space of the housing, the thermoelectric elements of the thermoelectric generator being arranged in the double-walled intermediate bottom which fluidically separates the cooling channel from the heating channel which is adjacent thereto, the double-walled intermediate bottom having one end mounted on one of the sidewalls, the double-walled intermediate bottom having another end mounted on the other one of the sidewalls, the double-walled intermediate bottom fully extending from the one sidewall to the other side wall, wherein
- the heating channels are fluidically coupled to the exhaust system and the cooling channels are fluidically coupled to the cooling circuit;
- heating medium connecting tubes;
- cooling medium connecting tubes;
- another heating channel to provide at least two heating channels; and
- another cooling channel to provide at least two cooling channels wherein at least one of:
- the at least two heating channels are fluidically connected to one another via one of the heating medium connecting tubes, said one of the heating medium connecting tubes extending through one of the cooling channels and another of the heating medium connecting tubes extending through at least one intermediate bottom; and
- the at least two cooling medium channels are fluidically connected to one another via one of the cooling medium connecting tubes, said one of the cooling medium connecting tubes extending through one of the heating channels and through at least one intermediate bottom.

12. The internal combustion engine according to claim 11, wherein:
- the thermoelectric elements of the thermoelectric generator in the intermediate bottom are individually unencapsulated; and
- the intermediate bottom forms at least a portion of a group encapsulation of the thermoelectric elements.

13. A heat exchanger comprising:
- a housing enclosing an interior space, said housing having sidewalls on diametrically opposite sides of said interior space;
- a double-walled partition arranged in said housing, said double-walled partition dividing said interior space into a heating channel and a cooling channel, said double-walled partition having a hot wall adjacent said heating channel and having a cooling wall adjacent said cooling channel, said hot wall and said cooling wall being spaced apart from each other to define an intermediate space between said hot wall and said cooling wall, said double-walled partition having one end mounted on one of said sidewalls, said double-walled partition having another end mounted on the other one of said sidewalls, said double-walled partition extending from said one sidewall to said other side wall, said double-walled partition fluidically separating said cooling channel from said heating channel, a plurality of said double-walled partitions are arranged in said housing and divide said interior space into a plurality of said heating channels and a plurality of said cooling channels, each of said plurality of double-walled partitions having one end mounted on said one sidewall, said each double-walled partition having another end mounted on said other sidewall, said each double-walled partition extending from said one sidewall to said other side wall, said each double-walled partition having a hot wall adjacent to one of said plurality of heating channels and having a cooling wall adjacent to one of said plurality of cooling channels, said each double-walled partition defining an intermediate space between a respective hot wall and cooling wall, all of said plurality of double walled partitions fluidically separating said plurality of cooling channels from said plurality of heating channels;
- a plurality of thermoelectric generators arranged in each of said plurality of double-walled partitions, each of said plurality of thermoelectric generators comprising a plurality of thermoelectric elements having a hot side in contact with said hot wall of a respective double-walled partition, and having a cool side in contact with said cooling wall of said respective double-walled partition;
- a cooling medium inlet and a cooling medium outlet arranged in said housing in a fluid connection with said cooling channel;
- a heating medium inlet and a heating medium outlet arranged in said housing in a fluid connection with said heating channel;
- heating medium connecting tubes passing through one of said cooling channels and passing through one of said double-walled partitions to fluidically connect one of said heating channels to another one of said heating channels;
- cooling medium connecting tubes passing through one of said heating channels and passing through one of said double-walled partitions to fluidically connect one of said cooling channels to another one of said cooling channels.

14. A heat exchanger in accordance with claim 13, wherein:
said thermoelectric elements of said thermoelectric generator in said double-walled partition are individually unencapsulated; and
said each double-walled partition forms a group encapsulation of said thermoelectric elements in a respective said double-walled partition;
said intermediate space is sealed with respect to the heating channels and the cooling channels;
said plurality of double-walled partitions are arranged to have said cooling channels closer to an outside of said housing than said heating channels.

15. A heat exchanger in accordance with claim 13, wherein:
one of said connecting tubes is arranged in said interior space and spaced from said sidewalls of said housing.

16. A heat exchanger, in particular for an exhaust system of an internal combustion engine, the heat exchanger comprising:
a thermoelectric generator comprising multiple-thermoelectric elements, each of which have a hot side and a cold side;
a heating channel for conducting a heating medium, the heating channel being arranged on the hot sides of the thermoelectric elements of the thermoelectric generator;
a cooling channel for conducting a cooling medium, the cooling channel being arranged on the cold sides of the thermoelectric elements of the thermoelectric generator, wherein the thermoelectric generator, the heating channel and the cooling channel are arranged adjacent to each other in a stacking direction and form a channel stack;
housing covering an interior space, the interior space receiving the channel stack, the housing comprising a cooling medium inlet, a cooling medium outlet, a heating medium inlet and a heating medium outlet and electrical connections for the thermoelectric generator, the housing having sidewalls on diametrically opposite sides of the interior space;
a double-walled intermediate bottom in the interior space of the housing, the thermoelectric elements of the thermoelectric generator being arranged in the double-walled intermediate bottom which fluidically separates the cooling channel from the heating channel which is adjacent thereto, the double-walled intermediate bottom having one end mounted on one of the sidewalls, the double-walled intermediate bottom having another end mounted on the other one of the sidewalls, the double-walled intermediate bottom extending from the one sidewall to the other side wall;
heating medium connecting tubes;
cooling medium connecting tubes;
another heating channel to provide at least two heating channels; and
another cooling channel to provide at least two cooling channels wherein at least one of:
the at least two heating channels are fluidically connected to one another via one of the heating medium connecting tubes, said one of the heating medium connecting tubes extending through one of the cooling channels and another of the heating medium connecting tubes extending through at least one intermediate bottom; and
the at least two cooling medium channels are fluidically connected to one another via one of the cooling medium connecting tubes, said one of the cooling medium connecting tubes extending through one of the heating channels and through at least one intermediate bottom.

17. The heat exchanger according to claim 16, wherein the connecting tubes extend in the interior space, spaced from the housing.

* * * * *